United States Patent [19]

Shimizu et al.

[11] 4,271,261
[45] Jun. 2, 1981

[54] DEVELOPER COMPOSITION FOR LITHOGRAPHIC PRINTING PLATES

[75] Inventors: Shigeki Shimizu, Tokyo; Hiroshi Ide, Yokohama, both of Japan

[73] Assignee: Mitsubishi Chemical Industries Limited, Tokyo, Japan

[21] Appl. No.: 106,010

[22] Filed: Dec. 21, 1979

[30] Foreign Application Priority Data

Dec. 25, 1978 [JP] Japan ............... 53-159658

[51] Int. Cl.³ .................... G03C 5/00; G03C 5/24
[52] U.S. Cl. ..................... 430/325; 430/285; 430/302; 430/306; 430/309; 430/294; 430/433; 430/435; 430/464; 430/486
[58] Field of Search ............. 430/302, 306, 309, 325, 430/294, 433, 435, 434, 464, 486, 285; 252/170

[56] References Cited

U.S. PATENT DOCUMENTS

| | | | |
|---|---|---|---|
| 3,682,641 | 8/1972 | Casler | 430/325 |
| 3,707,373 | 12/1972 | Martinson et al. | 430/309 X |
| 3,996,054 | 12/1976 | Santemma | 430/377 |
| 4,055,515 | 10/1977 | Kirch | 430/435 X |
| 4,186,006 | 1/1980 | Kobayashi et al. | 430/309 X |

Primary Examiner—Ward C. Kimlin
Attorney, Agent, or Firm—Oblon, Fisher, Spivak, McClelland & Maier

[57] ABSTRACT

A developer composition for a lithographic printing plate provided with a coated layer composed of a photosensitive polymer having in the main chain thereof groups of formula (I)

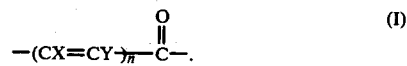

wherein X and Y independently represent hydrogen, halogen, cyano or nitro, and n is an integer of 1 or 2, comprising ethylene glycol monophenyl ether and at least one acid selected from the group consisting of a mineral acid, an organic carboxylic acid and an organic sulfonic acid.

10 Claims, No Drawings

DEVELOPER COMPOSITION FOR LITHOGRAPHIC PRINTING PLATES

BACKGROUND OF THE INVENTION

1. Field of the Invention

This invention relates to a developer composition for lithographic printing plates.

2. Description of the Prior Art

Photosensitive polymers of the photocrosslinkable type have been widely used practically as a photoetching resist. Photosensitive polymers and polymer compositions of this type exhibit excellent characteristics such as sensitivity, stability, image strength, and the like, and are superior to photosensitive diazo materials which have been heretofore used in the preparation of lithographic printing plates. Accordingly, photo-crosslinkable, photosensitive polymers have recently come into widespread use in the preparation of lithographic printing plates. These types of photosensitive polymers crosslink and harden upon exposure to actinic light and become relatively insoluble in solvents in comparison to the unexposed polymer starting material. The differences in properties between exposed areas and unexposed areas of a plate are utilized in the photographic preparation of printing plates. That is, the photosensitive polymer is coated on a lithographic support as a layer together with additives such as, for example, sensitizers, colorants, and the like, and then the plate coated with the layer is exposed to an imagewise pattern of radiation thereby creating soluble and insoluble areas in the photosensitive layer. Thereafter, the plate is treated with a developer solvent or solution for the unexposed polymer to develop the image by removing the unexposed, unhardened, soluble polymer therefrom.

Since it is advantageous to produce an image which is visible at the time of development, a dye or pigment is usually incorporated in the photosensitive layer. In this connection, however, a problem arises in that the proper choice of developer solution is more difficult when these colorants, particularly a pigment, are present. Unless there is a very careful balance in the properties of the developer solution with the properties of the pigment or dye which is used for coloring the photosensitive layer some of the pigment or dye is left to some extent in the unexposed area of the layer upon development which creates stains by deposition of ink on the unexposed area when the plate is used for printing. Accordingly, a developer solution which is used for a lithographic printing plate containing a colored polymer composition must cleanly develop an image on the plate surface without impairing the coated layer in the exposed area by removing unwanted portions of the polymer and by not leaching pigment from the exposed areas.

A further problem with the clean development of lithographic printing plates of the type which have colored coatings of a photosensitive polymer is that plates which have been kept for a considerable time before use are less easily developed than freshly prepared plates, i.e. an unusual amount of staining or scumming takes place on older plates. It is desirable, therefore, that the developer solution produce developed plates without stain and scum not only from fresh plates, but also from aged plates.

In recent years, most of the developments in lithographic plates have been automated and have been achieved by the use of automatic developing machines. In this case, the developer solution is in most cases recirculated repeatedly for reuse. However, when the developer solution which has been employed in such automated processes is used over a period of time, it becomes fatigued and its developing ability diminishes which prevents the lithographic plate from being rapidly and cleanly developed. Therefore, a need continues to exist for a developer solution which exhibits a low rate of fatigue, possesses excellent storage stability and is capable of stable development over a long period of time.

Another aspect of the problem in the lithographic art is that because automatic developing machines are employed which are made of rubber parts, plastic parts, metal parts and the like, contact of the rubber and plastic parts with the developer solution employed may result in swelling and/or dissolution of the rubber or plastic parts, while the metal parts may corrode depending upon the composition of the developer solution. Accordingly, there is a need for developer solutions which exhibit the above-described desirable developing characteristics for lithographic plates and which do not result in damage to the individual parts of the automatic developing machine thereby making it possible to select materials for parts of the developing machine from the widest variety of materials possible.

The developer compositions of the type conventionally used are satisfactory to some extent for cleanly developing lithographic printing plates when they are fresh. However, few standard developer compositions are known which exhibit satisfactory stability characteristics or which do not exhibit a tendency to damage the materials from which automatic developing machines are made. For instance, a standard developer composition which consists of γ-butyrolactone and an acid presents no problems in the clean development of lithographic plates when it is fresh. However, it gives a strongly offensive odor because γ-butyrolactone decomposes during storage or its refining condition is unsatisfactory. Moreover, γ-butyrolactone based developer solutions tend to swell components of automatic developing machines which are made from chloroprene rubbers or silicone rubbers. Therefore, suitable materials from which machine components can be fabricated are limited when γ-butyrolactone based developer solutions are used.

Intensive studies have been conducted on the storage stability of various developer compositions and, as a result, it has been found that the fatigue which the developer solutions of the above-mentioned type exhibits stems greatly from the incorporation of water into the composition, aside from thermal instabilities of the individual components of the developer solution. Even though careful measures are taken to prevent moisture from being incorporated into developer solutions of this type, moisture or water droplets are inevitably absorbed or incorporated into the developer solution when used in automatic developing machines since the developer solution in most cases has to be recycled in practical developing operations and particularly with automatic developing machines. Therefore, a need continues to exist for a developer composition which is usable over a long period of time and which does not incur changes in quality of the developer solution even with the incorporation of given amounts of water in the composition.

SUMMARY OF THE INVENTION

One object of the present invention is to provide a developer composition for lithographic printing plates provided with a colored coated layer composed of a photosensitive polymer, which is capable of cleanly and rapidly removing unexposed portions of the colored photosensitive coating without impairing exposed portions of the coated layer.

Another object of the invention is to provide a developer composition which is capable of readily developing not only freshly prepared lithographic plates having a photosensitive polymer coated thereon, but also aged lithographic plates.

A further object of the invention is to provide a developer composition which shows a slow rate of fatigue development when reused by circulation, exhibits excellent storage stability, and is stable during development over long periods of time.

Yet another object of the invention is to provide a developer composition which exhibits a broad developing spectrum exhibiting a stable developing effect with changes of developing conditions.

A still further object of the invention is to provide a developer composition which shows little or no tendency to damage most of the materials which are used as parts in automatic developing machines.

Briefly, these and other objects of the present invention as hereinafter will become more readily apparent can be attained by a developer composition for a lithographic printing plate provided with a coated layer composed of a photosensitive polymer having in the main chain thereof groups of formula (I)

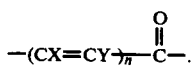

$$-(CX=CY)_{\overline{n}}-\overset{O}{\overset{\|}{C}}-. \quad (I)$$

wherein X and Y independently represent hydrogen, halogen, cyano or nitro, and n is an integer of 1 or 2, comprising ethylene glycol monophenyl ether and at least one acid selected from the group consisting of a mineral acid, an organic carboxylic acid and an organic sulfonic acid.

DETAILED DESCRIPTION OF THE PREFERRED EMBODIMENT

Ethylene glycol monophenyl ether is one of the essential components of the developer composition of the invention. Solvents which are used in developer compositions should preferably exhibit low volatility from the viewpoint of workability and safety and should preferably have a boiling point above 150° C. Among the solvents which have these desirable properties is ethylene glycol monophenyl ether. It also is an excellent solvent for unexposed photosensitive polymer of formula I in unexposed areas of a plate and its ability to dissolve the polymer is barely adversely affected by the presence of moisture in the solvent. This latter characteristic is the most important feature of the developer composition of the present invention and this is why the developer composition is stable against the incorporation of moisture. The amount of ethylene glycol monophenyl ether component employed in the present composition generally ranges from 5–90 wt%, preferably 30–60 wt%. The present developer composition may also contain a secondary component what are considered to be poor solvents for unexposed photosensitive polymer, if necessary, so that the developer compositions may exhibit good solvent action for polymer composition in unexposed areas of a film, but at the same time avoid swelling the polymer composition in exposed areas of the film. Accordingly, the incorporation of the second solvent components adjusts the dissolving power of the developer composition by avoiding solvent damage to exposed areas of a film. Modification of the dissolving power of the present composition results in a diminished tendency to damage the rubber parts or plastic parts of automatic developing machines.

Suitable secondary solvents include, for example, diethylene glycol monoalkyl ethers such as diethylene glycol monomethyl ether, diethylene glycol monoethyl ether, diethylene glycol monobutyl ether and the like; triethylene glycol monoalkyl ethers such as triethylene glycol monomethyl ether, triethylene glycol monoethyl ether and the like; diethylene glycol monoalkyl ether acetates such as diethylene glycol monomethyl ether acetate, diethylene glycol monoethyl ether acetate, diethylene glycol monobutyl ether acetate and the like; triethylene glycol monoalkyl ether acetates such as triethylene glycol monomethyl ether acetate, triethylene glycol monoethyl ether acetate and the like; ethylene glycol monoalkyl ether acetates such as ethylene glycol monomethyl ether acetate, ethylene glycol monoethyl ether acetate, ethylene glycol monobutyl ether acetate and the like; ethylene glycol monoalkyl ethers such as ethylene glycol monopropyl ether, ethylene glycol monoisopropyl ether, ethylene glycol monobutyl ether, ethylene glycol monoisobutyl ether and the like; and tetrahydrofurfurylalcohol. Water may also be used as a component of the composition upon addition of an acid component.

Preferably, the secondary solvent component is very soluble in water. In many cases, water-based agents for a desensitizing treatment of the developed layer subsequent to the developing treatment are used. If the developer solution has a strong affinity for water, the developer solution can be easily removed from the surface of the lithographic plate by the water-based desensitizing agent. From this particular standpoint such solvents as ethylene glycol monoalkyl ethers, diethylene glycol monoalkyl ether acetates, and tetrahydrofurfuryl alcohol are preferred secondary solvents.

The amount of secondary solvent employed generally ranges from 30%–70 wt% of the developer composition. Water may be incorporated in the developer composition upon addition of an acid component. The amount of water is preferably less than 10 wt% of the developer composition. If the amount of water present in the composition exceeds 10 wt%, the dissolving action of the developer composition decreases.

In order to prevent scum or stain from being produced on the non-image portions of the lithographic plate, it is necessary to include an acid component in the developer composition of the present invention. Suitable acid materials include mineral acids such as phosphoric acid, sulfuric acid, hydrochloric acid and the like; organic carboxylic acids such as acetic acid, lactic acid, glycollic acid, α-pentenoic acid and the like; and organic sulfonic acids such as benzenesulfonic acid, paratoluenesulfonic acid and the like. When hydrochloric acid is used, it should preferably be used in as small an amount as possible since the acid readily attacks the metallic components of the automatic developing machine. A preferred acid is phosphoric acid. In general, a substantial amount of an acid in the developer composition ranges from 0.1–10 wt% of the developer composition. Since acidic development is favorable, the amount of added acid should be so controlled that the developer composition is rendered acidic, preferably in a pH of about 1–6.

Aside from the above-described developer composition components, the developer composition may preferably contain other additives such as one or more wetting agents or surface active agents so that when the lithographic plate is subjected to the developer solution, the developer should easily spread over the plate surface in good condition and it should prevent readhering of the polymer and pigment once removed from non-imaged areas of the plate. Suitable examples of wetting or surface active agents include polyhydric alcohols such as glycerol, diethylene glycol and the like; phosphoric esters of alkanols such a n-hexanol, n-decanol and the like; polyethers such as polyoxyethylene octylphenyl ether, polyoxyethylene oleyl ether and the like; and organic acid esters such as sodium dialkylsuccinate.

In order to improve the tendency of ink to deposit on the exposed, hardened image areas of a lithographic plate, the developer should preferably contain one or more oleophilic improvers such methyl abietate, ethyl abietate or the like.

Apart from the above-indicated additives, the developer composition may further contain small amounts of other additives including, for example, a basic amine such as triethanolamine or salt thereof such as a phosphate of triethanolamine in order to prevent formation of stains or scums in the non-image areas of the plate by effectively removing the photosensitive layer composition therefrom or to prevent the polymer composition in image areas from swelling. The total amount of additives which can be incorporated in the developer composition preferably is not more than 10 wt% of the total amount of the developer composition.

The developer composition of the invention is effective in treating lithographic plates with a coated layer of a photosensitive polymer thereon having groups represented by formula (I) in the main chain of the polymer, wherein suitable polymeric materials include polyesters, polycarbonates, polysulfonates and the like. Especially suitable photosensitive polymer are polyesters, which can be easily prepared, for example, by polycondensing polyvalent carboxylic acids or ester derivatives thereof having the group of formula (I) on the main chain with polyhydric alcohols in the usual manner. Sutiable examples of polyvalent carboxylic acids include p-phenylenediacrylic acid, p-carboxycinnamic acid, bis(p-carboxybenzal)cyclopentanone, bis(p-carboxycinnamoyl)benzene, p,p'-chalcone dicarboxylic acid, fumaric acid, maleic acid and the like. Of these, p-phenylenediacrylic acid is most preferred. Alternatively, other polyvalent carboxylic acids such as succinic acid, adipic acid, terephthalic acid and the like may be used as well.

Suitable examples of the polyhydric alcohols include ethylene glycol, diethylene glycol, triethylene glycol, tetraethylene glycol, propylene glycol, dipropylene glycol, tripropylene glycol, 1,3-propanediol, hydrogenated bisphenol A, hydrogenated bisphenol F, bis($\beta$-hydroxyethoxy) cyclohexane, p,p'-dihydroxychalcone and the like. The alcohols may be used singly or in combination.

The lithographic plate is usually prepared by applying the photosensitive polymer together with any other desired additives such as, for example, a sensitizer, a colorant such as a phthalocyanine pigment, or the like, in the usual manner as a layer on a support. If the phthalocyanine pigment is used, a lithographic plate is obtained which has a colored coated layer thereon.

Suitable supports for the printing plate include metal sheets such as aluminum, mechanically, electrochemically or chemically surface-treated aluminum, copper, zinc, and the like, paper sheets, polymer-coated papers, synthetic resin sheets and the like. The most preferred type of support for the lithographic plate is disclosed in U.S. Pat. No. 3,511,661.

Development of a plate using the developer composition of the invention can be achieved in the usual manner. For instance, the developer solution of the invention is applied to the surface of a lithographic plate which has been subjected to an image exposure and non-exposed areas of the photosensitive polymer composition are removed from the support surface. The removal of the polymer composition from the non-image areas of the lithographic plate can be effectively achieved by a gentle mechanical action such as the wiping of the plate surface.

Having generally described the invention, a further understanding can be obtained by reference to certain specific examples which are provided herein for purpose of illustration only and are not intended to be limiting unless otherwise specified.

EXAMPLE 1

To a 4 wt% cyclohexanone solution of a photosensitive polyester which had been prepared by condensing 0.4 moles of p-phenylenediacrylic acid with 0.2 moles of hydrogenated bisphenol A and 0.2 moles of triethylene glycol were added 2-dibenzoylmethylene-3-methyl-$\beta$-naphthothiazoline in an amount of 5 wt% of the polyester and a phthalocyanine pigment in an amount of 20 wt% of the polyester to obtain a photosensitive solution. The thus obtained photosensitive solution was applied to an electrolyzed aluminum plate in a thickness of 1.0–1.2 $\mu$m. The lithographic plate was dried, exposed to light through a negative film, and developed with a developer composition of the following formulation.

ethylene glycol monophenyl ether: 50 wt%
diethyleneglycol monoethyl ether acetate: 20
diethylene glycol monomethyl ether: 20
water: 5
85% phosphoric acid: 5

It was found that the polymer composition in the exposed, hardened image areas of the developed printing plate was substantially free of swelling and suffered no damage, and no staining of the pigment in the non-image areas was found. When this plate was used for printing, good copies were obtained without involving stains on the non-image areas.

EXAMPLE 2

The lithographic plate obtained in Example 1 was subjected prior to exposure and development, to a forced deterioration test for 10 days under the condition of 40° C. and a relative humidity of 80% or under conditions of 55° C. and a relative humidity of less than 10%. In general, each deteriorated plate was contaminated with stains or scums since the polymer composition was not completely removed from non-exposed areas during development. However, when the developer solution of Example 1 was used to develop the deteriorated plates, good development was attained similar to the case of Example 1 and the appearance of stain or scum on the non-image areas was not found in the printing test thereby giving good printed material.

COMPARATIVE EXAMPLE 1

A developer composition of the following formulation containing γ-butyrolactone and an acid was prepared for comparative purposes.

γ-butyrolactone: 84 wt%
γ-hydroxybutyric acid: 3
phosphoric acid: 3
water: 5
glycerine: 5

This γ-butyrolactone-based developer solution was used to develop lithographic plates under conditions similar to those of Examples 1 and 2, with good developing results. However, when 3% water was added to the developer solution of the Comparative Example and to the developer composition of Example 1, and then lithographic plates were developed with the developer solutions in a fashion similar to Example 1, the unexposed polymer composition was not effectively removed and remained in the case of the developer solution of Comparative Example 1.

With the developer composition of Example 1, a good developing effect was obtained without any inconvenience.

EXAMPLE 3

Rubber materials which are employed in the fabrication of rubber parts of automatic developing machines were immersed in the developer composition of Example 1 and the developer solution of the Comparative Example. The materials were allowed to stand for 3 weeks at 50° C. in each developer to determine the extent of weight changes in the rubber materials. The results are shown in Table 1.

TABLE 1

|  | developer solution of Example 1 | developer solution of Comparative Example 1 |
|---|---|---|
| chloroprene rubber | −1% | +17% |
| soft silicone rubber | +2.5% | −14.5% |
| hard silicone rubber | +2.5% | +4.5% |

From the above results, it is evident that the developer composition of the present invention shows less of a tendency to damage the rubber materials which are used in the manufacture of automatic developing machines.

EXAMPLE 4

To a 4 wt% cyclohexanone solution of a photosensitive polyester which had been prepared by condensing 1.0 mole of p-phenylenediacrylic acid with 0.35 moles of hydrogenated bisphenol A and 0.65 moles of triethylene glycol were added 1,8-dimethoxyanthraquinone and a phthalocyanine pigment in amounts of 10 wt% and 15 wt% based on the polyester, respectively, to give a photosensitive solution. The photosensitive solution was coated on an electrolyzed aluminum plate to a thickness of 1.0–1.2 μm. The thus obtained lithographic plate was dried, exposed through a negative film, and developed with a developer composition of the following formulation. The developing treatment was conducted by an automatic developing machine equipped with a rubbing mechanism using a rotary brush roller.

ethylene glycol monophenyl ether: 50 wt%
tetrahydrofurfuryl alcohol: 40
diethylene glycol monomethyl ether: 5
85% phosphoric acid: 3
water: 2

During development, the treating speed of the automatic developing machine or the feed rate of the lithographic plate was varied from 0.5 m/min to 2 m/min. The developed image, e.g. a grey scale, on the plate did not exhibit any changes. The exposed, hardened image of the polymer composition on the plate was substantially free of swelling and suffered no damage, and no staining of the pigment in the non-image areas was observed. When the plate was used for printing, no stain on the non-image areas was found and good printed material could be obtained.

COMPARATIVE EXAMPLE 2

The lithographic plate of Example 4 was developed in the same manner as described in Example 4 using a developer composition of the following formulation.

γ-butyrolactone: 83 wt%
glycerine: 5
γ-hydroxybutyric acid monoglyceride: 3
γ-hydroxybutyric acid: 3
p-toluenesulfonic acid: 2
water: 4

The developed plate exhibited a well developed image and no stain could be found on the non-image areas of the plate. However, when the feed rate of the plate in the automatic developing machine was varied from 0.5 m/min to 2 m/min, the grey scale image which formed on the plate changed by a maximum of one step.

EXAMPLE 5

The developer solution of the formulation of Example 4 was repeatedly used to develop the plate of the same type as described in Example 1. That is, 200 m² of a non-exposed lithographic plate was developed but no deposited component was found in the developer solution, with the plate being cleanly developed without staining. Thereafter, when the lithographic plate which had been subjected to an imagewise exposure, was developed with the repeatedly employed developer solution, the plate exhibited no stain and showed a well developed image on the plate. Printing with this plate gave good printed material without involving any stain on the non-image areas.

Having now fully described this invention, it will be apparent to one of ordinary skill in the art that many changes and modifications can be made thereto without departing from the spirit or scope of the invention as set forth herein.

What is claimed:

1. A method of developing an image in a light exposed photosensitive coating of a lithographic printing plate, said coating composed of a photosensitive polymer having in the main chain thereof groups of the formula:

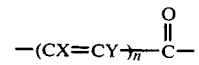

wherein X and Y independently represent hydrogen, halogen, cyano or nitro, and n in an integer of one or two, comprising: washing the exposed portions of said exposed photosensitive coating from said plate with a developer solution comprising ethylene glycol monophenyl ether and at least one acid selected from the group consisting of a mineral acid, an organic carboxylic acid and an organic sulfonic acid.

2. The method of claim 1, wherein the amount of ethylene glycol monophenyl ether in said developer solution is in the range of 30–60 wt.%.

3. The method of claim 1, wherein the amount of said acid developer composition is in the range of 0.1–10 wt.%.

4. The method of claim 3, wherein the acid is phosphoric acid.

5. The method of claim 1, which further comprises a secondary solvent.

6. The method of claim 5, wherein the amount of said secondary solvent in said developer composition is in the range of 30–70 wt.%.

7. The method of claim 5, wherein said secondary solvent is at least one solvent selected from the group consisting of ethylene glycol monoalkyl ethers, diethylene glycol monoalkyl ethers, diethylene glycol monoalkyl ester acetates and tetrahydrofurfuryl alcohol.

8. The methods of claim 1, which further comprises at least one additive selected from the group consisting of wetting agents, surface active agents and oleophilic improvers.

9. The method of claim 1, which further comprises a basic amine or salt thereof.

10. The method of claim 1, wherein said developer composition has a pH of 1–6.

* * * * *